United States Patent [19]
Matthews

[11] 4,447,290
[45] May 8, 1984

[54] CMOS PROCESS WITH UNIQUE PLASMA ETCHING STEP

[75] Inventor: James A. Matthews, Santa Clara, Calif.

[73] Assignee: Intel Corporation, Santa Clara, Calif.

[21] Appl. No.: 516,529

[22] Filed: Jul. 25, 1983

Related U.S. Application Data

[62] Division of Ser. No. 387,050, Jun. 10, 1982, Pat. No. 4,412,375.

[51] Int. Cl.³ ............... H01L 21/306; B44C 1/22; C03C 15/00; C03C 25/06
[52] U.S. Cl. ................... 156/626; 156/643; 156/646; 156/653; 156/657; 156/659.1; 156/662; 204/192 E; 252/79.1
[58] Field of Search ............... 156/643, 646, 626, 627, 156/653, 657, 659.1, 662, 345; 204/164, 192 EC, 192 E, 298; 430/313, 317; 252/79.1; 427/38, 39; 29/571, 576 B, 578, 579; 148/1.5, 187

[56] References Cited

U.S. PATENT DOCUMENTS 4,330,384  5/1982  Okudaira et al. ............... 204/192 E Primary Examiner—William A. Powell
Attorney, Agent, or Firm—Blakely, Sokoloff, Taylor & Zafman

[57] ABSTRACT

A CMOS process which provides a self-aligned guardband in a high density circuit is disclosed. A polysilicon masking member is used to define a well and also to provide alignment for the guardband. A single plasma etching step etches silicon nitride in one area and both silicon nitride and polysilicon in another area prior to growth of field oxides.

1 Claim, 10 Drawing Figures

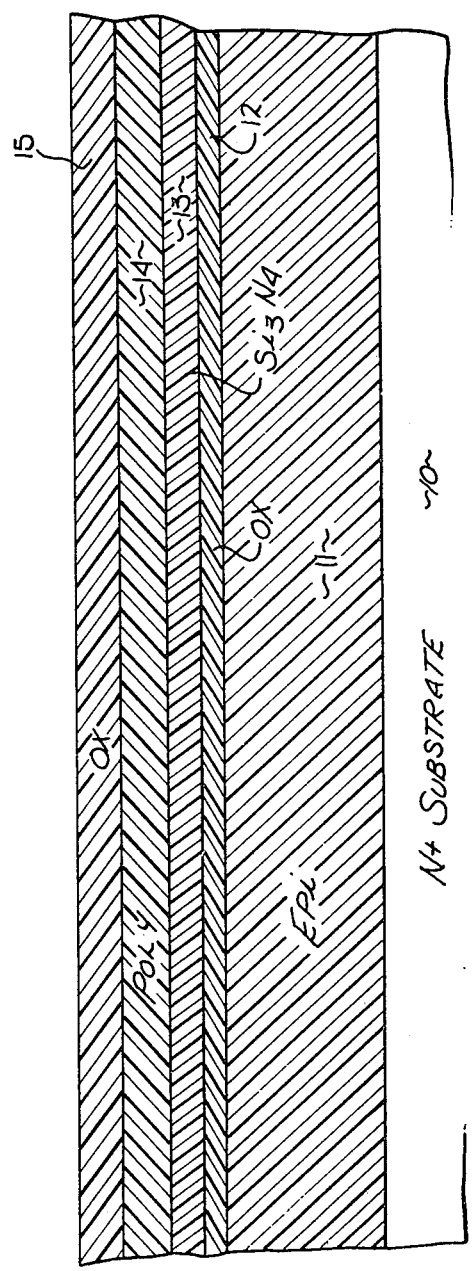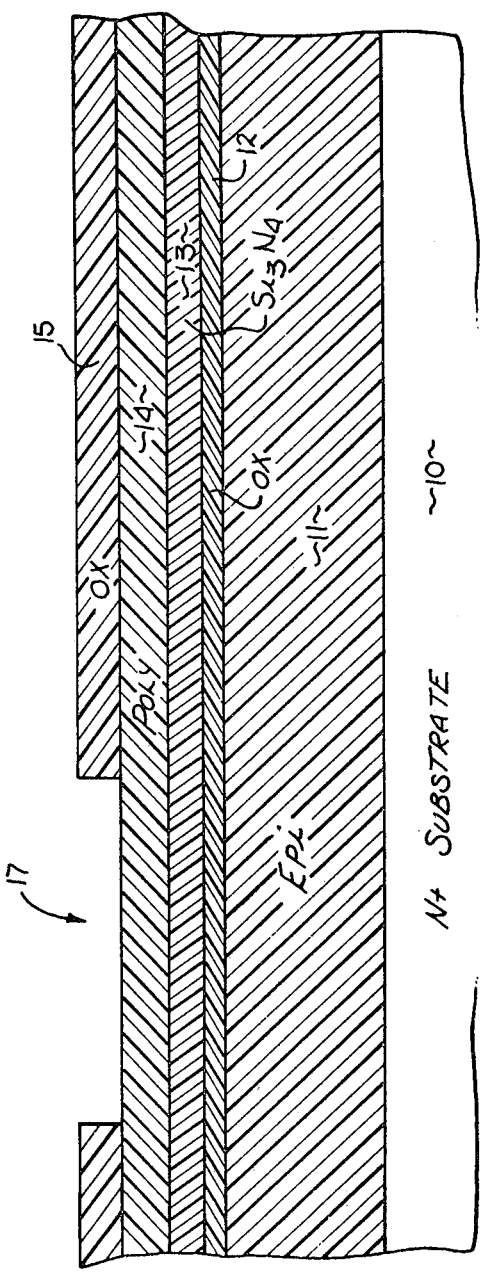

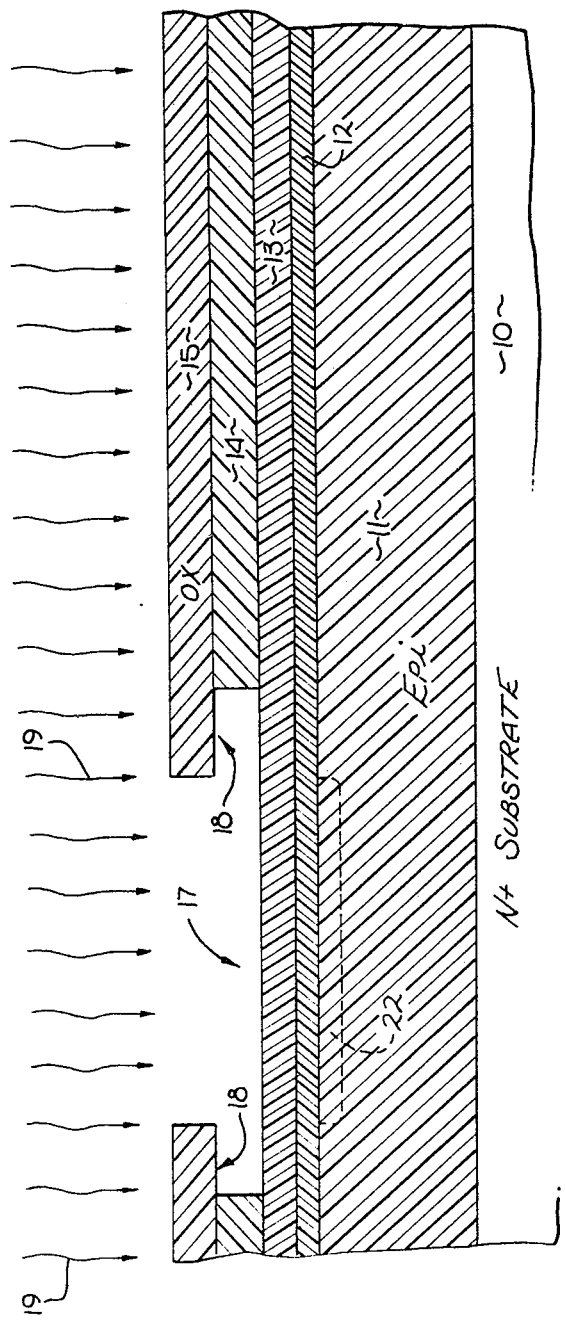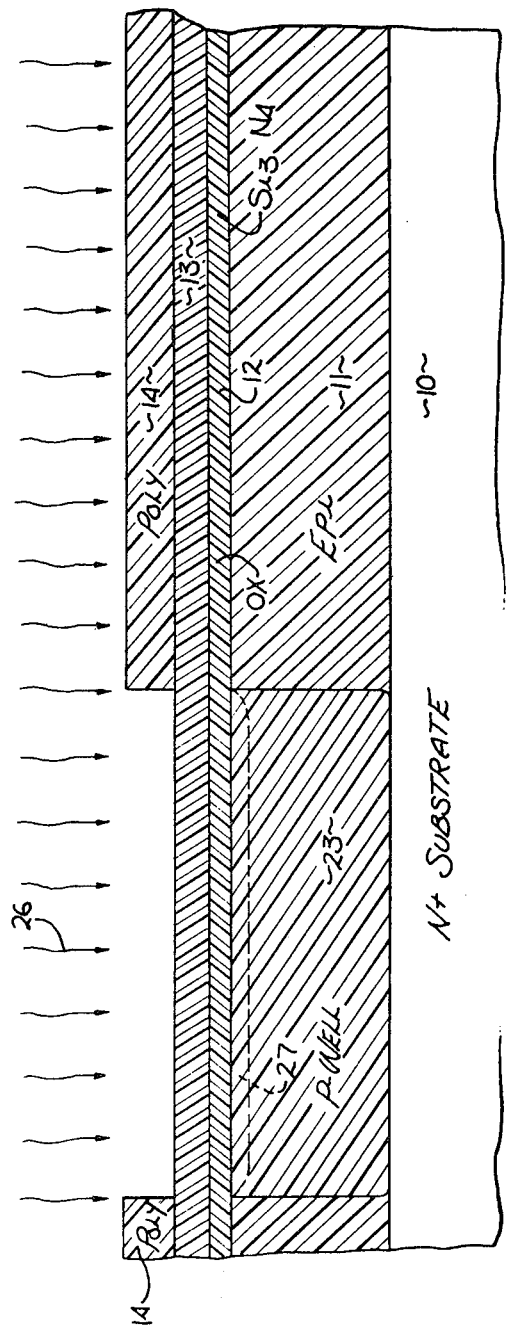

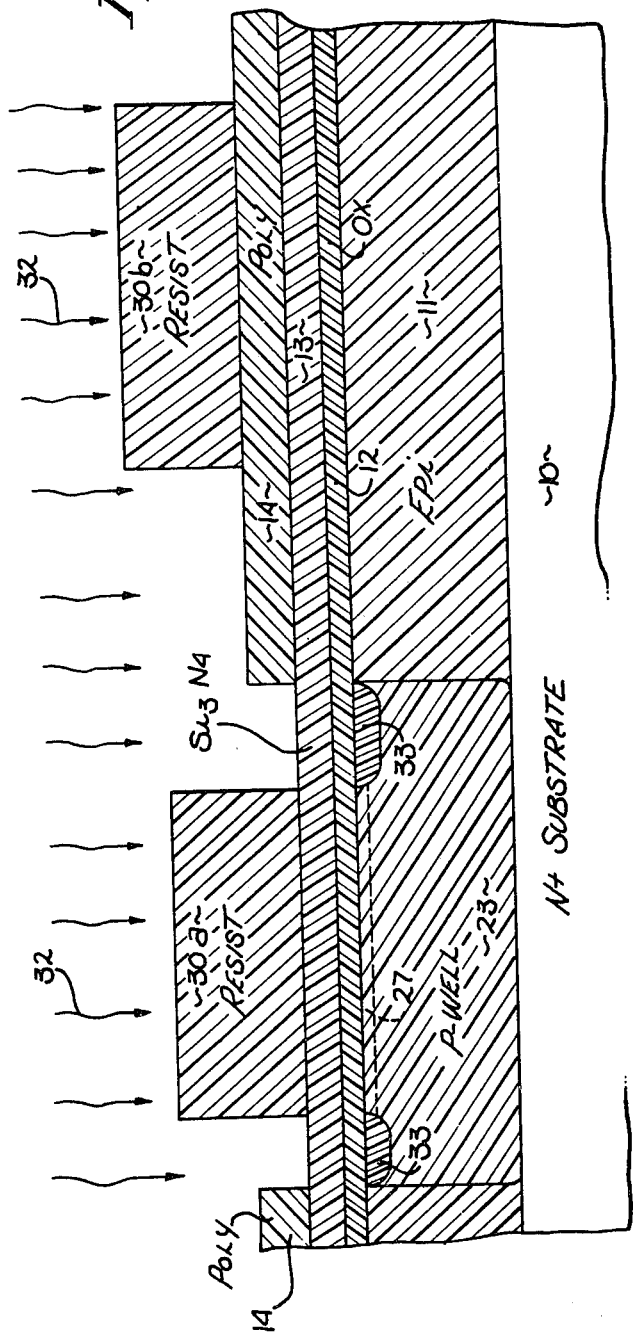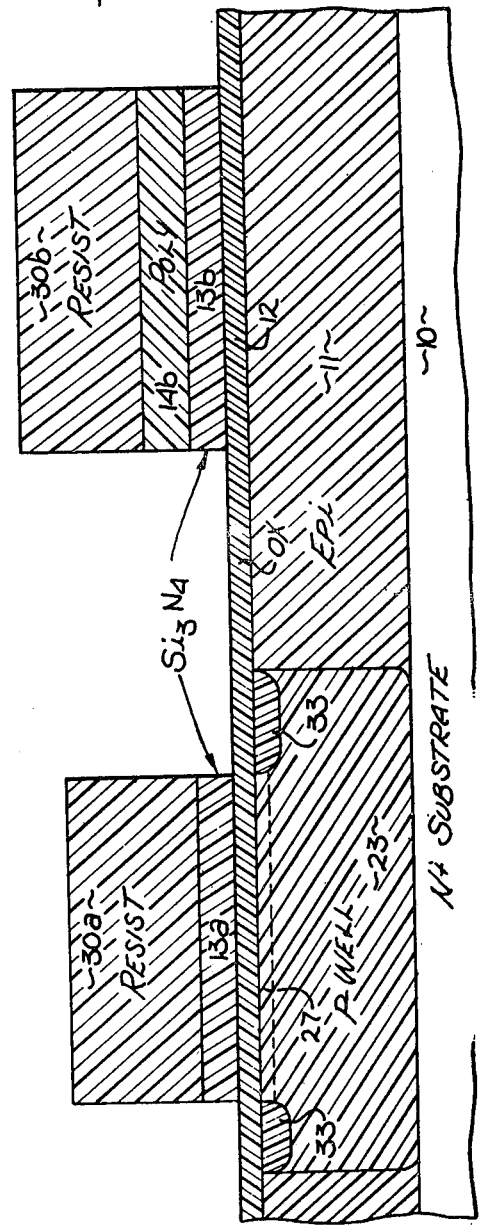

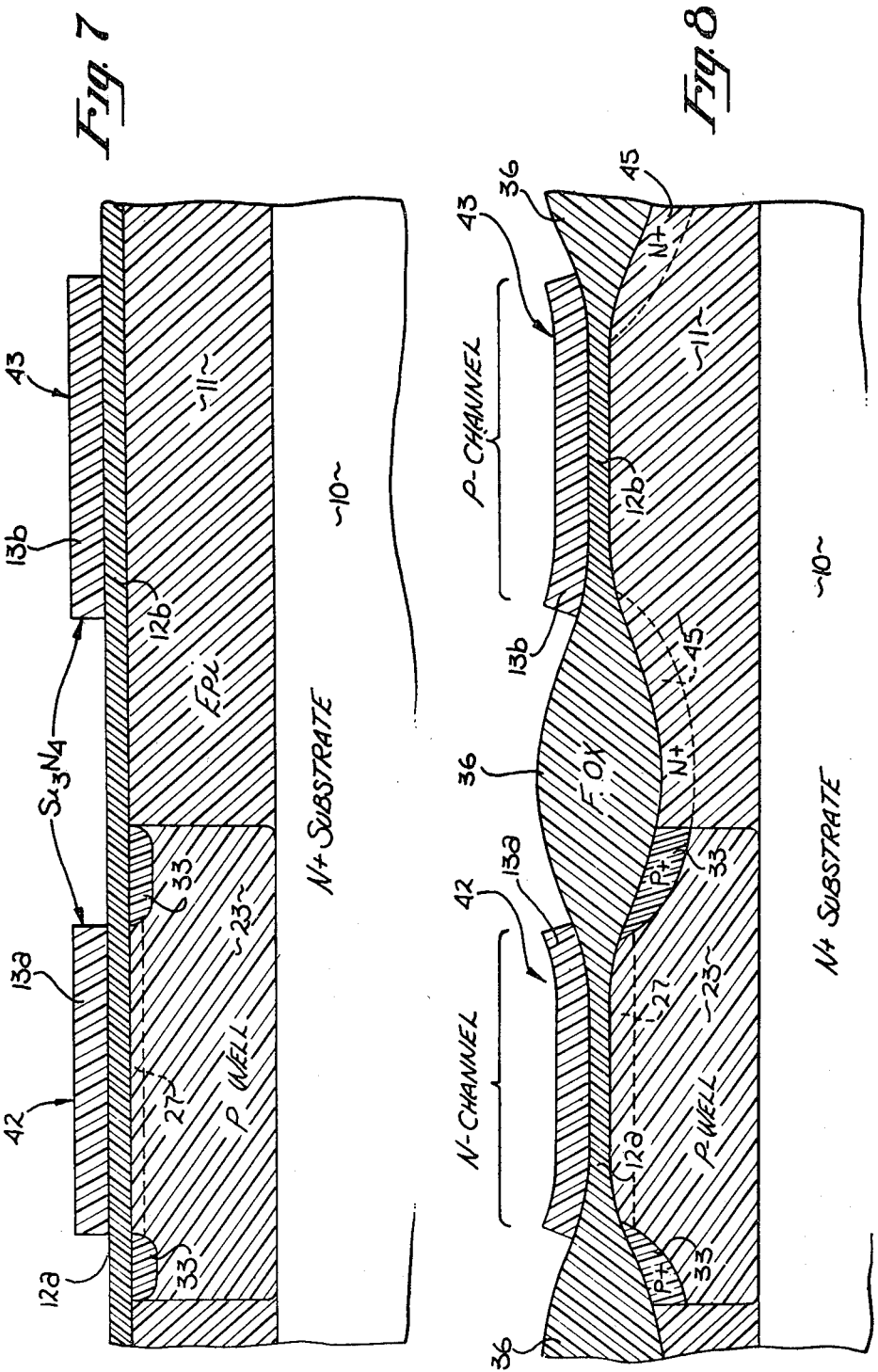

CMOS PROCESS WITH UNIQUE PLASMA ETCHING STEP

This is a divisional of application Ser. No. 387,050 filed June 10, 1982, U.S. Pat. No. 4,412,375.

BACKGROUND OF THE INVENTION

1. Field of the Invention

The invention relates to the field of complementary metal-oxide-semiconductor (CMOS) integrated circuit processing.

2. Prior Art

In the fabrication of complementary MOS transistors, guardbands are employed between the complementary devices to reduce parasitic current paths. Numerous processes are known for forming these guardbands, for example, see U.S. Pat. Nos. 4,013,484 and 4,282,648. As will be seen the present invention provides a unique process for forming the guardbands, and in particular a process is disclosed where the guardbands are self-aligned within a well.

CMOS integrated circuits are known to have a number of advantages over p-channel or n-channel circuits, such as high noise immunity, low power consumption and a very high resistance to soft failures associated with ionizing radiation. One major problem with CMOS circuits is their tendency to become "latched." Numerous transistor-like parasitic paths are formed in CMOS circuits and damaging currents flow through these paths when the circuit becomes latched. One proposed solution to the latching problem includes the use of a highly conductive substrate and the formation of active devices in an epitaxial layer grown on the substrate. In its presently preferred embodiment, the invented process is used with such an epitaxial layer.

SUMMARY OF THE INVENTION

A complementary metal-oxide-semiconductor (CMOS) process is described. An oxide layer, silicon nitride layer and polysilicon layer are formed over a silicon substrate. An opening is formed in the polysilicon layer and then a well is formed in the substrate through this opening. First and second masking members are formed, the first member being disposed in the opening and the second member being spaced apart from the opening. Next the substrate is subjected to a doping step such that a doped region is formed between the first masking member and the opening defined by the polysilicon layer, thereby defining a guardband in the opening. The silicon nitride layer is now etched in alignment with the first masking member, and simultaneously the polysilicon layer and silicon nitride layer are etched in alignment with the second masking member. This forms first and second silicon nitride members on the substrate. Now a field oxide layer is grown between the spaced apart silicon nitride members. The areas beneath the first and second silicon nitride members are used for n-channel and p-channel (complementary) transistors.

One advantage to the inventive process is that the guardband formed in the well is self aligned within the well and beneath the subsequently formed field oxide regions. This permits higher density CMOS fabrication.

Also disclosed is an improved end point detection step for plasma etching, particularly for etching of polysilicon.

BRIEF DESCRIPTION OF THE DRAWINGS

FIG. 1 is a cross-sectional elevation view of a substrate which includes an epitaxial layer, a first oxide layer, silicon nitride layer, polysilicon layer and a second oxide layer.

FIG. 2 illustrates the substrate of FIG. 1 after an opening has been formed through the second oxide layer.

FIG. 3 illustrates the substrate of FIG. 2 after the polysilicon layer has been etched. FIG. 3 also illustrates an ion implantation step.

FIG. 4 illustrates the substrate of FIG. 3 after a drive step used to form a well in the substrate and during another ion implantation step.

FIG. 5 illustrates the substrate of FIG. 4 after photoresist masking members have been formed on the substrate and during an ion implantation step.

FIG. 6 illustrates the substrate of FIG. 5 after a plasma etching step.

FIG. 7 illustrates the substrate of FIG. 6 after removal of the photoresist masking members and remaining polysilicon.

FIG. 8 illustrates the substrate of FIG. 7 after the growth of field oxide regions on the substrate.

DETAILED DESCRIPTION OF THE INVENTION

Figure 9:
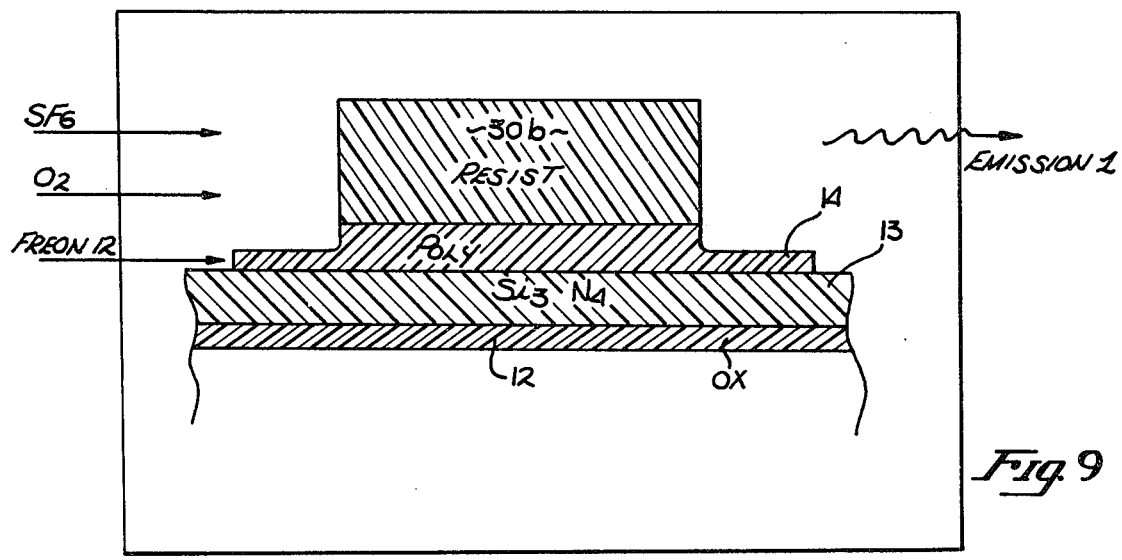
FIG. 9 illustrates a portion of the substrate of FIG. 5 during a plasma etching step.

A complementary metal-oxide-semiconductor (CMOS) process is described, and in particular "front end" processing steps for forming host regions for the complementary field-effect transistors. In the following description numerous specific details are set forth such as specific doping levels, conductivity types, thicknesses, etc. in order to provide a thorough understanding of the present invention. However, it will be obvious to one skilled in the art that the present invention may be practiced without these specific details. In other instances well-known steps have not been described in detail such as cleaning steps in order not to unnecessarily obscure the present invention.

As will be seen in the presently preferred embodiment, the invented process is used to form a p-type well in an epitaxial layer. The invention, however, can be used to form an n-type well, and moreover, the described process need not be used with an epitaxial layer.

Referring now to FIG. 1, a monocrystalline silicon substrate 10 is illustrated. This substrate is highly doped with antimony and in the presently preferred embodiment, it has a resistivity of 0.01 ohm-cm, thus it is almost metallic. A more lightly doped n-type epitaxial layer 11 is formed on the substrate using an ordinary epitaxial process. (This layer along with other layers are sometimes collectively referred to as the "substrate" in the following description). The layer 11 is approximately 5 microns thick and is phosphorus doped to a resistance level of approximately 0.6 ohm-cm. Active devices are formed within the epitaxial layer 11. The more lightly doped epitaxial layer on the heavily doped substrate greatly reduces the parasitic paths associated with latch-up as mentioned in the prior art section.

A silicon dioxide (oxide) layer 12 is grown on the epitaxial layer 11. This layer in the presently preferred embodiment is approximately 800 A thick. A silicon nitride layer 13 of approximately 1000 A thick is formed over the oxide layer 12. Then a polycrystalline silicon (polysilicon) layer 14 is formed over the silicon nitride layer 13. In the presently preferred embodiment this layer is approximately 5500 A thick. An oxide layer 15 is grown on the polysilicon layer 14 to a thickness of approximately 2700 A.

Referring now to FIG. 2, an ordinary masking and etching step are used to define an opening 17 through the oxide layer 15. As will be seen, this opening is used for defining a p-type well. By way of illustration the opening may be approximately 5 microns wide where current production photolithographic techniques are used.

Next, as shown in FIG. 3, the polysilicon layer 14 is etched at the opening 17. This etching is continued to allow undercutting of the polysilicon, thus forming the oxide overhangs 18. In the presently preferred process, these overhangs are approximately 2 microns in width (per side). This undercutting is relatively easy to control with polysilicon as is well known.

The substrate is now subjected to ion implantation as illustrated by lines 19. Boron is implanted at an energy level of 100 keV to a level of approximately $7.0 \times 10^{12}/cm^2$. The overhangs 18 prevent the doping of the epitaxial layer 11 beneath the overhangs, thus a doped region 22 is formed generally in alignment with the opening 17. (The oxide layer 15 is thick enough along with layers 12 and 13 to block the ions.) A high temperature drive step is used to drive the dopant into the epitaxial layer to form the p-well 23 illustrated in FIG. 4. An ordinary high temperature step is used for instance, the substrate's temperature is gradually raised to a temperature of approximately 1100° C. and maintained at this temperature for 20 hours.

As shown in FIG. 4, after removal of the oxide layer 15 the substrate is subjected to an additional ion implantation step as illustrated by lines 26. This step is used to establish the threshold voltage for the n-channel devices which are subsequently formed within the p-well 23. For the presently preferred devices, a boron implant is used and at an energy level of 100 keV with a dose of approximately $1.0 \times 10^{12}/cm^2$. This doping is illustrated by region 27.

Now a photoresist layer is formed over the substrate and first and second masking members are defined from this layer using an ordinary masking step. The photoresist masking member 30a as shown in FIG. 5 is formed within the opening 17 (above the well 23). The second masking member 30b is formed spaced apart from the well 23 and over the polysilicon layer 14. The substrate is again subjected to an ion implantation step as illustrated by lines 32. The photoresist members block the ion implantation as does the polysilicon layer 14. Thus, the dopant is only implanted in the region 33. When viewed in a plan view, the region 33 is a continuous band formed about the peripheral region of the p-type well 23. In the presently preferred process, a boron implantation is used at an energy level of 100 keV to obtain a dose of approximately $5 \times 10^{13}/cm^2$ in the region 33. The region 33 forms a guardband about the well 23.

A plasma etching step is next used to etch the silicon nitride layer 13 in alignment with the masking member 30a and to simultaneously etch both the polysilicon layer 14 and the silicon nitride layer 13 in alignment with the masking member 30b. The resultant structure is shown in FIG. 6. The oxide layer 12 forms an etchant stop allowing the plasma etching step to be used without damage to the underlying epitaxial layer. A silicon nitride member 13a is formed below the photoresist member 30a and similarly a polysilicon member 14b and silicon nitride member 13b are formed below the photoresist member 30b.

Now as shown in FIG. 7, the photoresist members are removed, along with the remaining polysilicon is etched away forming oxide member 12a beneath the silicon nitride member 13a and oxide member 12b below silicon nitride member 13b.

Field oxide regions 36 are grown on the substrate (e.g. at 920° C. in a wet atmosphere). As is well known, the silicon nitride prevents formation of oxides, and thus, no oxide is formed at regions 42 and 43. This results in region 42 separated from region 43 by the field oxide 36 as shown in FIG. 8. During the growth of the field oxide 36, n-type dopant from the epitaxial layer 11 builds up against the growing oxide forming an n+ region 45. This region along with the region 33 completes the guardband between adjacent devices.

After removal of the silicon nitride members an n-channel device may be formed in the p-well at region 42 and a p-channel device may be formed at region 43. Well known steps may be used to form these devices or the devices may be fabricated as described in copending application Ser. No. 397,055, filed on July 12, 1982, assigned to the assignee of the present application.

In the plasma etching step used to etch the polysilicon nitride (compare FIGS. 5 and 6), $SF_6$ with 10% $O_2$ is used in a commercially available plasma etcher. A pressure of 0.4 torr is used until the end point is detected for the polysilicon etching. Then the pressure is reduced to 0.2 torr for the silicon nitride etching. The change in light emission (end point) at the completion of the polysilicon portion of the etching is somewhat difficult to sense. In contrast, the end point for the silicon nitride is easier to detect.

It has been found that the addition of a gas for providing an indication of the end point (hereinafter indicator gas) is very useful particularly for detecting the end point of the polysilicon etching. Perhaps this indicator gas is analogous to a titration indicator in wet chemistry.

The indicator gas can be any gas which gives a significantly large change in admission of light when a chemical change occurs in the etching reaction. This chemical change can be a change in the concentration in one of the reactants or a change in concentration of one of the end products. It has been found that Freon 12 is an excellent indicator gas for the plasma etching of polysilicon.

Figure 10:
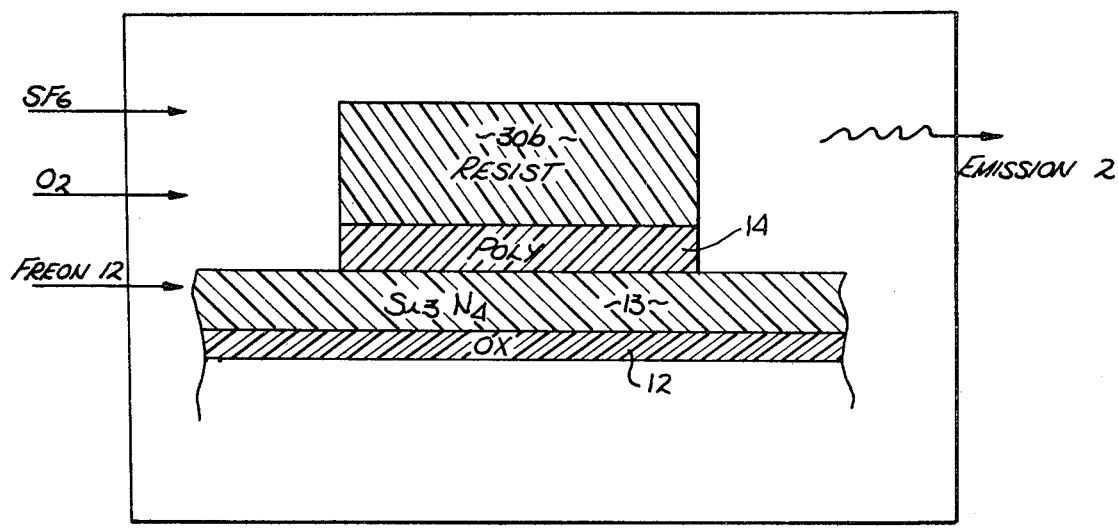
FIG. 10 illustrates the portion of the substrate of FIG. 9 during the plasma etching step after the polysilicon has been etched.

In FIG. 9 the plasma etching step where the polysilicon layer 14 is etched in alignment with the photoresist layer 30d is illustrated. The normally used gases for this step are $SF_6$ and oxygen as mentioned. With the improvement of the present invention, Freon 12 is added in an amount of approximately 5 percent (partial pressure). As long as substantial amounts of polysilicon remain, a first emission shown as emission 1 in FIG. 9 results. As soon as the polysilicon layer is consumed as shown in FIG. 10, then a substantial change in emission occurs, shown as emission 2 in FIG. 10.

The applicant is not sure why a large change in emission occurs once the polysilicon is consumed. Indeed, the chemistry is extremely complicated and does not lend itself to simple analysis. However, it is believed that the Freon is consumed in substantial quantities by the fluorine radicals once the polysilicon has been etched. This sudden consumption of the Freon, it is believed, provides the substantial change in light emission. While, in the present invention, the Freon 12 is used to detect the end point of the polysilicon etching, it can be used for detecting the end points in other plasma etching processes.

A number of the above-described steps result in better fabrication than is possible with prior art processing. For instance, the overhangs 18 of FIG. 3 cause the dopant 22 to be spaced-apart from the edge of the polysilicon layer 14 before the high temperature driver step. After the driver step which forms the p-well 23, the well is approximately aligned with the edge of the polysilicon layer 14 (see FIG. 4). The polysilicon layer 16 thus carries the masking information for the p-well. This allows the easy implantation of the dopant used to adjust the threshold voltage of the n-channel devices and also the self alignment of the guardband about the well 23. The polysilicon is not only able to withstand the high temperature needed to form the p-well, but also is very suitable for controlling the undercutting associated with the overhangs 18. The plasma etching step used to define the structure of FIG. 6 etches two different materials (polysilicon and silicon nitride) from around one masking member while only the silicon nitride is etched around the other masking member.

Thus, front end processing steps have been described for a CMOS process which allows higher density fabrication than with the prior art processing.

I claim:

1. In the plasma etching of a polysilicon layer during the fabrication of an integrated circuit where $SF_6$ and $O_2$ are used for said etching, an improvement comprising:

adding $C_nF_m$ to said $SF_6$ and $O_2$ during said plasma etching to provide better end point detection.

* * * * *